(12) United States Patent
Kim

(10) Patent No.: US 11,910,591 B2
(45) Date of Patent: Feb. 20, 2024

(54) MEMORY CELL AND SEMICONDUCTOR MEMORY DEVICE WITH THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 231 days.

(21) Appl. No.: 17/399,471

(22) Filed: Aug. 11, 2021

(65) Prior Publication Data

US 2022/0271040 A1 Aug. 25, 2022

(30) Foreign Application Priority Data

Feb. 22, 2021 (KR) ........................ 10-2021-0023598

(51) Int. Cl.
*H10B 12/00* (2023.01)
*H01L 23/528* (2006.01)
*H01L 23/522* (2006.01)

(52) U.S. Cl.
CPC ....... *H10B 12/312* (2023.02); *H01L 23/5226* (2013.01); *H01L 23/5283* (2013.01); *H10B 12/50* (2023.02)

(58) Field of Classification Search
CPC ... H10B 12/312; H10B 12/50; H01L 23/5226; H01L 23/5283
USPC ........................................................ 257/296
See application file for complete search history.

(56) References Cited

U.S. PATENT DOCUMENTS 10,312,239 B2 * 6/2019 Tezuka ................ H01L 29/7869

* cited by examiner

*Primary Examiner* — Tu-Tu V Ho
(74) *Attorney, Agent, or Firm* — IP & T GROUP LLP

(57) ABSTRACT

The present invention provides a highly integrated memory cell and a semiconductor memory device including the same. According to the present invention, a semiconductor memory device comprises: a memory cell array in which a plurality of memory cells is vertically stacked to a substrate, wherein each of the memory cells includes: a bit line vertically oriented to the substrate; a capacitor laterally spaced apart from the bit line; an active layer laterally oriented between the bit line and the capacitor; and a word line and a back gate facing each other with the active layer interposed therebetween, and wherein an edge of the word line and an edge of the back gate have a step shape along a stacking direction of the memory cells.

23 Claims, 17 Drawing Sheets

MEMORY CELL AND SEMICONDUCTOR MEMORY DEVICE WITH THE SAME

CROSS-REFERENCE TO RELATED APPLICATIONS

The present application claims priority to Korean Patent Application No. 10-2021-0023598, filed on Feb. 22, 2021, which is herein incorporated by reference in its entirety.

BACKGROUND

1. Field

The present disclosure relates to a semiconductor device and, more particularly, to a memory cell or a semiconductor device including the same.

2. Description of the Related Art

Integration degree of two-dimensional semiconductor memory devices is mainly determined by the area occupied by unit memory cells. Thus, the integration degree is hugely affected by the level of technology for forming microscopic patterns. The integration degree of two-dimensional semiconductor memory devices is still increasing. The increase is limited, however, because highly expensive tools are required for refining patterns. Accordingly, three-dimensional (3D) semiconductor memory devices having 3-dimensionally arranged memory cells are being suggested.

SUMMARY

Embodiments of the present disclosure provide highly integrated memory cells and semiconductor memory devices including the same.

According to an embodiment of the present invention, a semiconductor memory device comprises a memory cell array in which a plurality of memory cells is vertically stacked to a substrate, wherein each of the memory cells includes: a bit line vertically oriented to the substrate; a capacitor laterally spaced apart from the bit line; an active layer laterally oriented between the bit line and the capacitor; and a word line and a back gate facing each other with the active layer interposed therebetween, and wherein an edge of the word line and an edge of the back gate have a step shape along a stacking direction of the memory cells.

According to an embodiment, a semiconductor memory device comprises a memory cell array in which a plurality of memory cells is stacked vertical to a substrate, wherein each of the memory cells includes: a bit line vertically oriented to the substrate; a capacitor laterally spaced apart from the bit line; an active layer including a thin-body channel, the thin-body being laterally disposed between the bit line and the capacitor; and a word line and a back gate facing each other with the thin-body channel interposed therebetween, and wherein an edge of the word line and an edge of the back gate have a step shape along a stacking direction of the memory cells.

The present disclosure can prevent interference among word lines by forming a back gate between vertically stacked memory cells.

DETAILED DESCRIPTION

Figure 1:
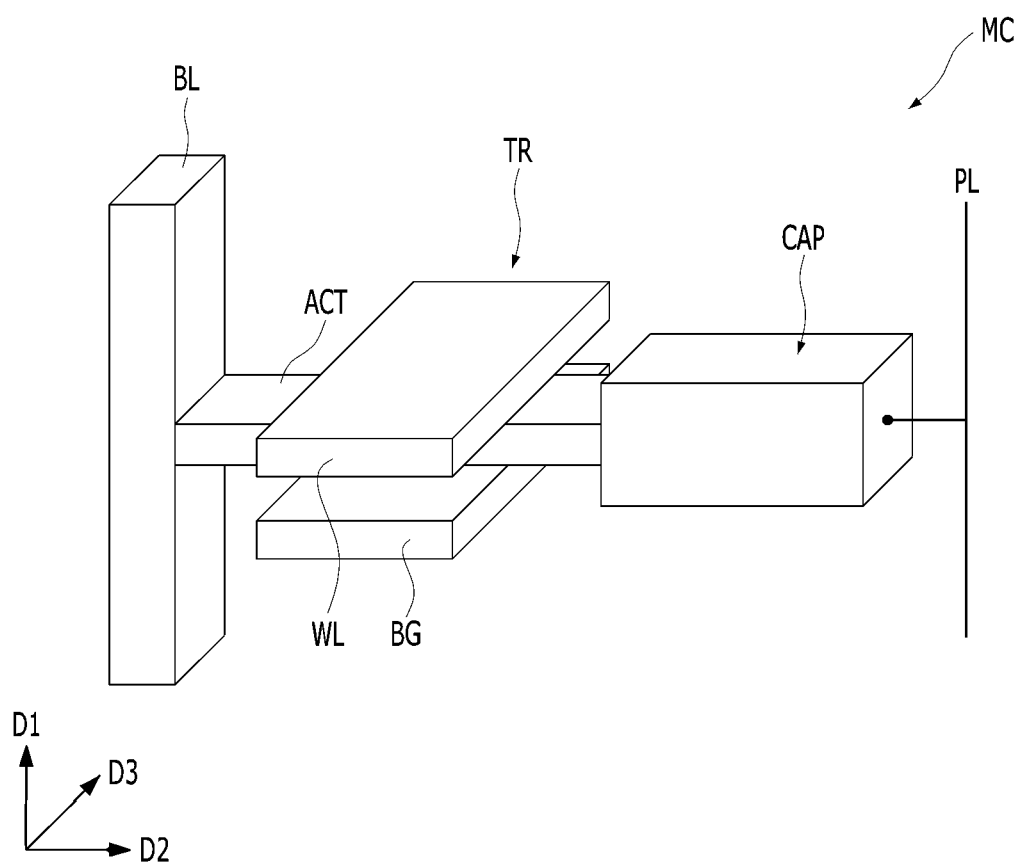
FIG. 1 is a schematic perspective view illustrating a memory cell of a semiconductor memory device according to an embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. The embodiments of the present invention are not limited to the specific structures shown in the drawings, but include any changes in the structures that may be produced according to the fabricating process. Also, any regions and shapes of regions illustrated in the drawings have schematic views are intended to illustrate specific examples of structures of regions of the various elements, and are not intended to limit the scope of the invention.

Embodiments described hereafter may increase memory cell density and decrease parasite capacitance by vertically stacking memory cells.

Figure 2:
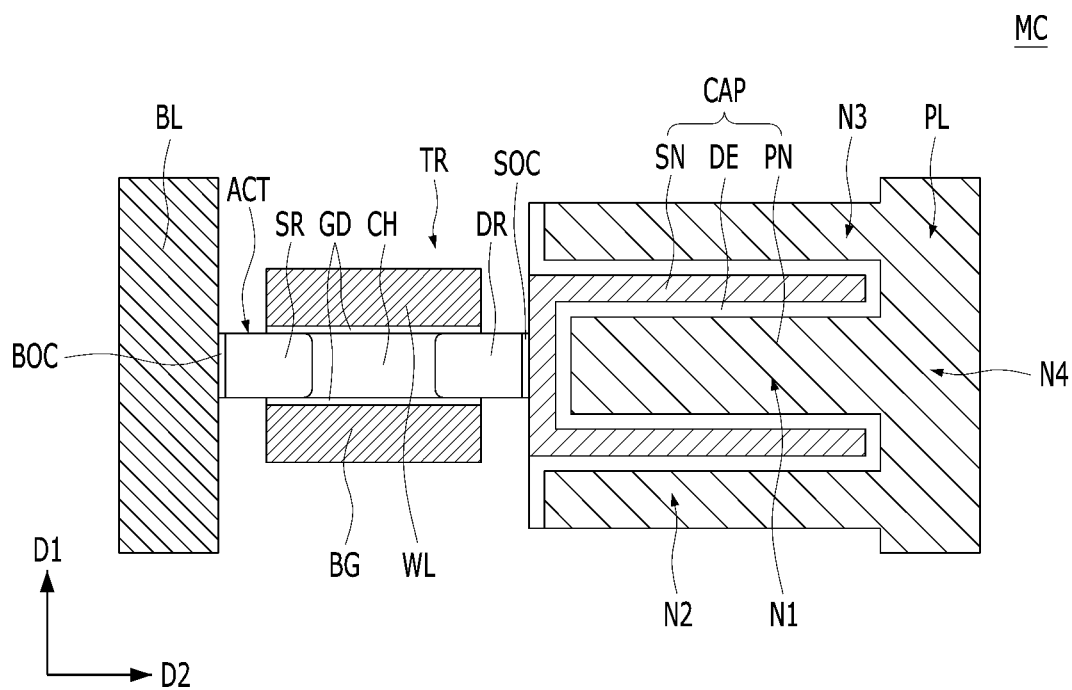
FIG. 2 is a cross-sectional view illustrating a memory cell of FIG. 1.

FIG. 1 is a schematic perspective view illustrating a memory cell of a semiconductor memory device according to an embodiment of the present invention. FIG. 2 is a cross-sectional view illustrating a memory cell of FIG. 1.

Referring to FIGS. 1 and 2, a memory cell MC of a 3D semiconductor memory device according to an embodiment of the present invention may include a bit line BL, a transistor TR, and a capacitor CAP. The transistor TR may include an active layer ACT, a gate dielectric layer GD, and a word line WL. The capacitor CAP may include a storage node SN, a dielectric layer DE, and a plate node PN. The bit line BL may have a pillar shape extending in a first direction D1. The active layer ACT may have a bar shape extending in a second direction D2 intersecting with the first direction Dl. The word line WL may have a line shape extending in a third direction D3 intersecting with both the first direction D1 and the second direction D2. The plate node PN of the capacitor CAP may be connected to a plate line PL.

The bit line BL may be vertically oriented along the first direction Dl. The bit line BL may be referred to as a vertically oriented bit line or a pillar shape bit line. The bit line BL may include a conductive material. The bit line BL may include a silicon-base material, a metal-base material, or a combination thereof. The bit line BL may include polysilicon, metal, metal nitride, metal silicide, or a combination thereof. The bit line BL may include polysilicon, titanium nitride, tungsten, or a combination thereof. For example, the bit line BL may include polysilicon doped with N-type impurities or titanium nitride (TiN). The bit line BL may include a stack of titanium nitride and tungsten (TiN/W).

The word line WL may be extended in the third direction D3, and the active layer ACT may be extended in the second direction D2. The active layer ACT may be laterally arranged from the bit line BL.

The gate dielectric layer GD may be formed on upper and lower surfaces of the active layer ACT. The gate dielectric layer GD may include silicon oxide, silicon nitride, metal oxide, metal oxynitride, metal silicate, a high-k material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, or HfSiON. The word line WL may include metal, metal mixture, metal alloy, or a semiconductor material. The word line WL may include titanium nitride, tungsten, polysilicon, or a combination thereof. For example, the word line WL may include a stack of TiN/W in which titanium nitride and tungsten are sequentially stacked in the recited order. The word line WL may include a N-type workfunction material or a P-type workfunction material. The N-type workfunction material may have a low workfunction of 4.5 eV or less. The P-type workfunction material may have a high workfunction of 4.5 eV or more.

The active layer ACT may include a semiconductor material or an oxide semiconductor material. For example, the active layer ACT may include polysilicon, germanium, silicon-germanium, or indium gallium zinc oxide (IGZO). The active layer ACT may include a channel CH, a first source/drain region SR between the channel CH and the bit line BL, and the second source/drain region DR between the channel CH and the capacitor CAP.

Both the first source/drain region SR and the second source/drain region DR may be doped with the same conductive impurity. The first source/drain region SR and the second source/drain region DR may be doped with an N-type impurity or a P-type impurity. The first source/drain region SR and the second source/drain region DR may include at least any one impurity selected from among arsenic (AS), phosphorus (P), boron (B), indium (In), and a combination thereof. A first side of the first source/drain region SR may be connected to the bit line BL, and a second side of the first source/drain region SR may be connected to the channel CH. A first side of the second source/drain region DR may be connected to the storage node SN, and a second side of the second source/drain region DR may be connected to the channel CH. Each of the second sides of the first source/drain region SR and the second source/drain region DR may partially overlap with a side of the word line WL. A lateral length of the channel CH along the second direction D2 may be shorter than each of lateral lengths of the first and second source/drain regions SR and DR along the second direction D2. In another embodiment, the lateral length of the channel CH along the second direction D2 may be longer than each of the lateral lengths of the first and second source/drain regions SR and DR along the second direction D2.

The transistor TR, as a cell-transistor, may have a single word line WL. A back gate BG may be disposed to face the word line WL with the active layer ACT interposed therebetween. The word line may be disposed above the active layer ACT and the back gate BG may be disposed below the active layer ACT. The back gate BG may be extended in the third direction D3. The word line WL and the back gate BG may be parallel to each other. The word line WL and the back gate BG may be made of the same material. For example, the back gate BG may include metal, metal mixture, metal alloy, or a semiconductor material. The back gate BG may include titanium nitride, tungsten, polysilicon, or a combination thereof. For example, the back gate may include a stack of TiN/W in which titanium nitride and tungsten are sequentially stacked in the recited order.

The word line WL and the back gate BG may have different potentials. For example, a word line driving voltage may be applied to the word line WL, and a reference (e.g., ground) voltage may be applied to the back gate BG. The back gate BG may serve to prevent interferences between the word lines WL of the memory cells MC, the memory cells MC being vertically disposed along the first direction D1.

Accordingly, the memory cell MC according to an embodiment of the present invention may have a double gate structure in which the word line WL and the back gate BG are adjacent to a single channel CH. In another embodiment, the word line WL may be disposed below the active layer ACT, the back gate BG may be disposed above the active layer ACT.

A bit line side-ohmic contact BOC may be formed between the first source/drain region SR and the bit line BL. The bit line side-ohmic contact BOC may have a height capable of fully covering a side of the first source/drain region SR. The bit line side-ohmic contact BOC may be formed through depositing and annealing a metal layer. For example, the bit line side-ohmic contact BOC may be formed by a reaction between the metal of the metal layer and the silicon of the first source/drain region SR. The bit line side-ohmic contact BOC may include titanium silicide, cobalt silicide, nickel silicide, and so forth.

The capacitor CAP may be laterally disposed from the transistor TR along the second direction D2. The capacitor CAP may include the storage node SN, which is laterally extended from the active layer ACT along the second direction D2. The capacitor CAP may further include the dielectric layer DE on the storage node SN and the plate node PN on the dielectric layer DE. The storage node SN, the dielectric layer DE, and the plate node PN may be laterally arranged along the second direction D2. The storage node SN may have a laterally oriented cylinder shape. The dielectric layer DE may conformally cover both a cylinder inner wall and a cylinder outer wall of the storage node SN. The plate node PN may have a shape extended in the cylinder inner wall and the cylinder outer wall of the storage node SN on the dielectric layer DE. The plate node PN may be connected to the plate line PL. The storage node SN may be electrically connected to the second source/drain region DR.

The storage node SN may have a 3D structure. The storage node SN of a 3D structure may have a lateral 3D structure oriented along the second direction D2. As an example of the 3D structure, the storage node SN may have a cylinder shape. In another embodiment, the storage node SN may have a pillar shape or a pylinder shape. The pylinder shape may refer to a structure in which a pillar shape and a cylinder shape are merged. The uppermost surface of the storage node SN may be at the same level with the top surface of the word line WL. The lowermost surface of the storage node SN may be at the same level with the bottom surface of the back gate BG.

The plate node PN may include an inner node N1 and outer nodes N2, N3, and N4. The inner node N1 and the outer nodes N2 to N4 may be interconnected. The inner node N1 may be disposed inside the cylinder of the storage node SN. The outer nodes N2 and N3 may be disposed outside the cylinder of the storage node SN with the dielectric layer DE interposed therebetween. The outer node N4 may interconnect the inner node N1 and the outer nodes N2 and N3. The outer nodes N2 and N3 may be disposed to surround the cylinder outer wall of the storage node SN. The outer node N4 may serve as the plate line PL.

The storage node SN and the plate node PN may include metal, noble metal, metal nitride, conductive metal oxide, conductive noble metal oxide, metallic carbide, metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-base material and a silicon-base material. For example, the plate node PN may include a titanium nitride/silicon germanium/tungsten nitride (TiN/SiGe/WN) stack. In the case that the plate node PN includes the titanium nitride/silicon germanium/tungsten nitride (TiN/SiGe/WN) stack, silicon germanium (SiGe) may be a gap-fill material filling inside the cylinder of the storage node SN, titanium nitride (TiN) may serve as the plate node PN of the capacitor CAP, and tungsten nitride (WN) may be a low-resistance material.

The dielectric layer DE may include silicon oxide, silicon nitride, a high-k material, or a combination thereof. A high-k material may have a higher dielectric constant than silicon oxide. Silicon oxide ($SiO_2$) may have a dielectric constant of about 3.9, and the dielectric layer DE may include a high-K material having a dielectric constant of 4 or more. A high-k material may have a dielectric constant of about 20 or more. A high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In an embodiment, the dielectric layer DE may be formed of a composite layer including two or more layers of the high-k materials mentioned above.

The dielectric layer DE may be formed of a zirconium (Zr)-base oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked in the recited order. The ZA and ZAZ stacks may be referred to as a zirconium oxide ($ZrO_2$)-base layer. In an embodiment, the dielectric layer DE may be formed of hafnium (Hf)-base oxide. The dielectric layer DE may have a stack structure including hafnium oxide ($HfO_2$). The stack structure including hafnium oxide ($HfO_2$) may include a HA ($HfO_2/Al_2O_3$) stack or a HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked in the recited order. The HA and HAH stacks may be referred to as a hafnium oxide ($HfO_2$)-base layer. Aluminum oxide ($Al_2O_3$) may have a bigger band gap than zirconium oxide ($ZrO_2$) and hafnium oxide ($HfO_2$) in the ZA stack, ZAZ stack, HA stack, and HAH stack. Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material, the high band gap material having a greater band gap than the high-k material. The dielectric layer DE may include silicon oxide ($SiO_2$) as a high band gap material other than aluminum oxide ($Al_2O_3$). Since the dielectric layer DE includes a high band gap material, leakage current may be suppressed. The high band gap material may be extremely thin. The high band gap material may be thinner than the high-k material. In another embodiment, the dielectric layer DE may include a laminated structure in which a high-k material and a high band gap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the laminated structures as recited above, aluminum oxide ($Al_2O_3$) may be extremely thin.

In an embodiment, the dielectric layer DE may include a stack structure, a laminated structure, or an intermixing structure including zirconium oxide, hafnium oxide, and aluminum oxide.

In an embodiment, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-base material.

The capacitor CAP may be replaced with other memory materials, for example, memory materials such as a phase change material, a magnetic tunnel junction (MTJ) material, or a variable resistor material.

A storage node side-ohmic contact SOC may be formed between the second source/drain region DR and the storage node SN.

The storage node side-ohmic contact SOC may have a height fully covering a side of the second source/drain region DR. The storage node side-ohmic contact SOC may be formed through depositing and annealing a metal layer. For example, the storage node side-ohmic contact SOC may be formed by a reaction between the metal of the metal layer and the silicon of the second source/drain region DR. The storage node side-ohmic contact SOC may include metal silicide. The storage node side-ohmic contact SOC may include titanium silicide, cobalt silicide, nickel silicide, and so forth.

Figure 3:
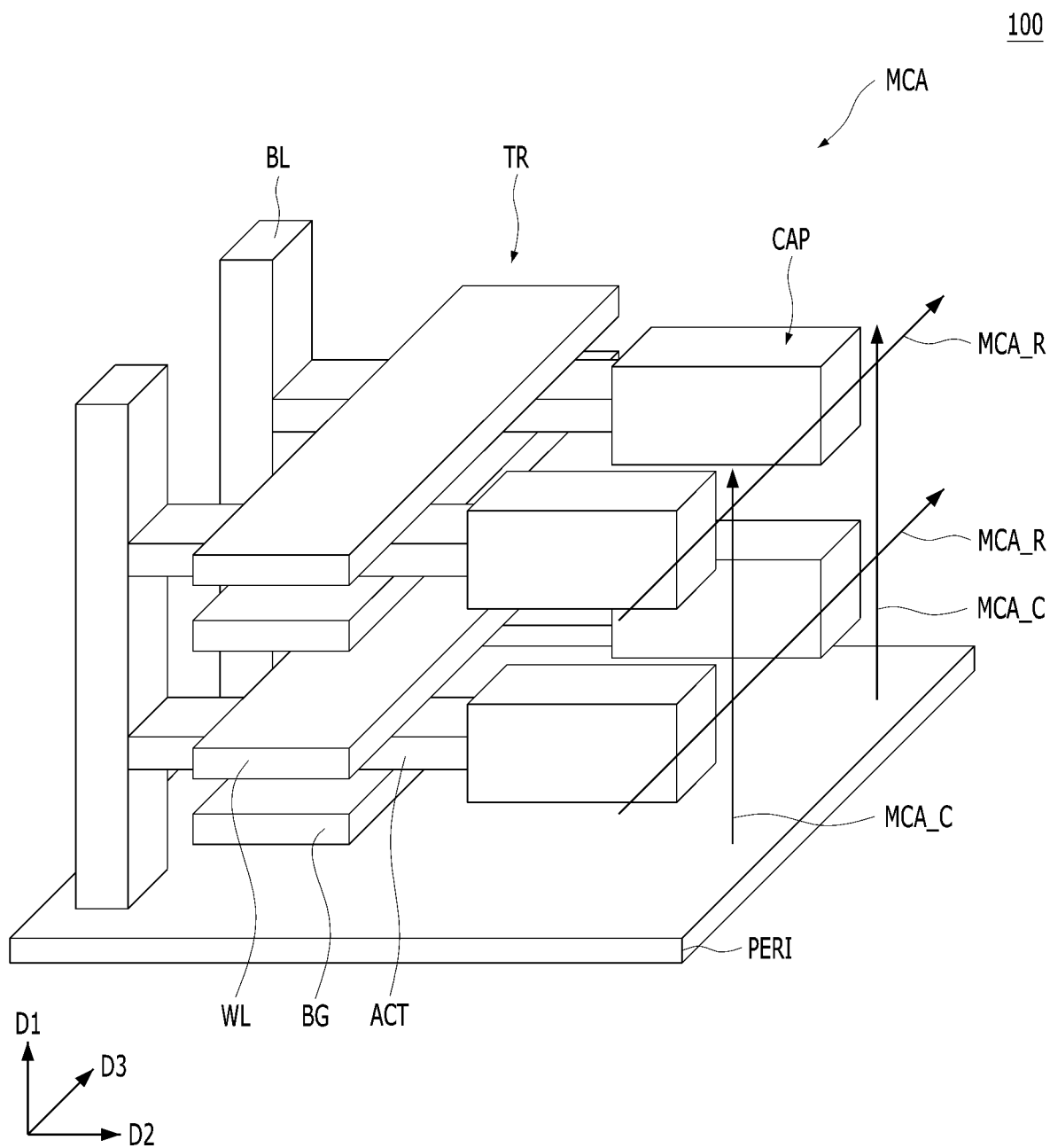
FIG. 3 is a schematic perspective view illustrating a semiconductor memory device according to an embodiment of the present invention.
Figure 4:
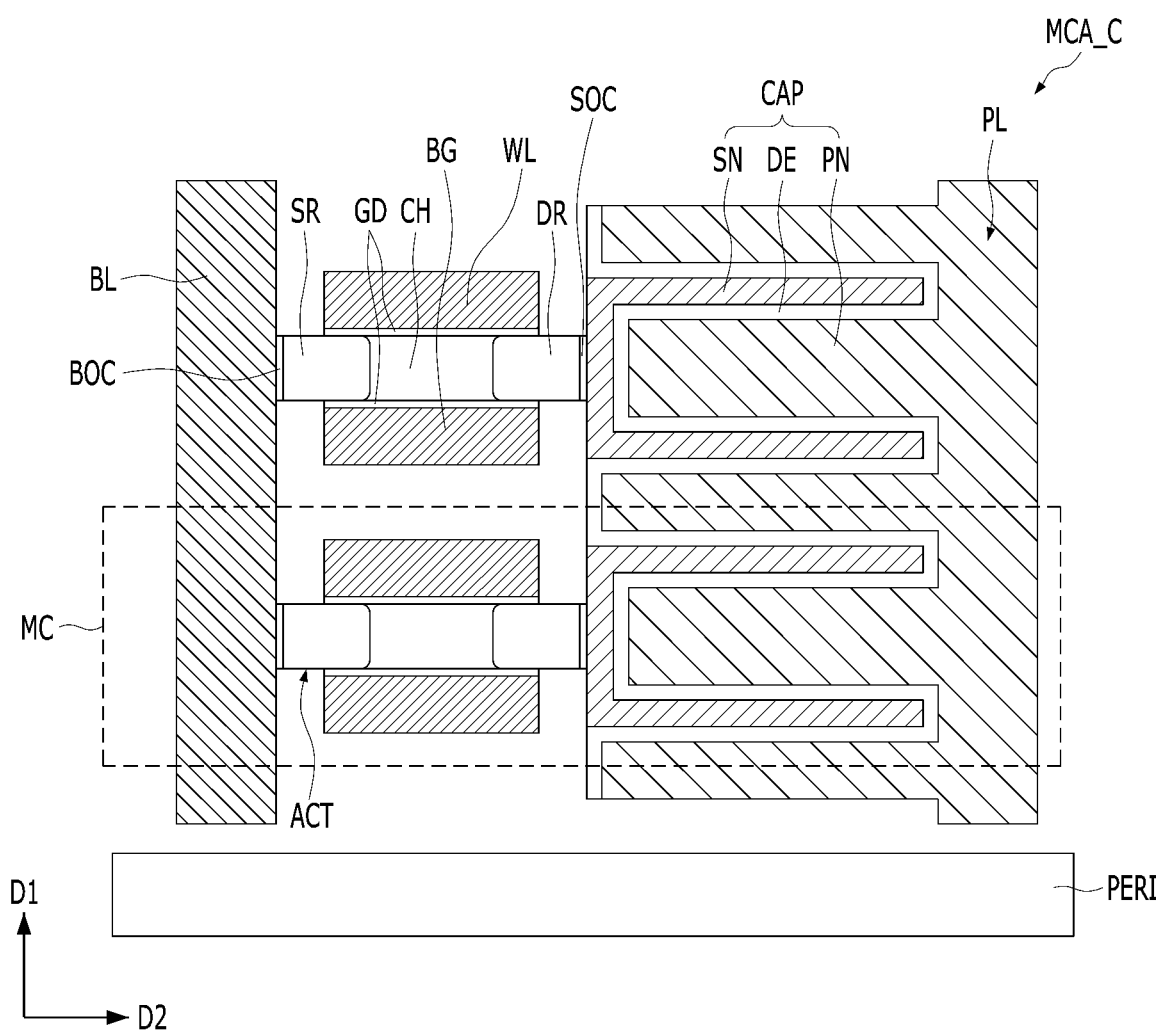
FIG. 4 is a cross-sectional view illustrating a vertical memory cell array of FIG. 3.
Figure 5:
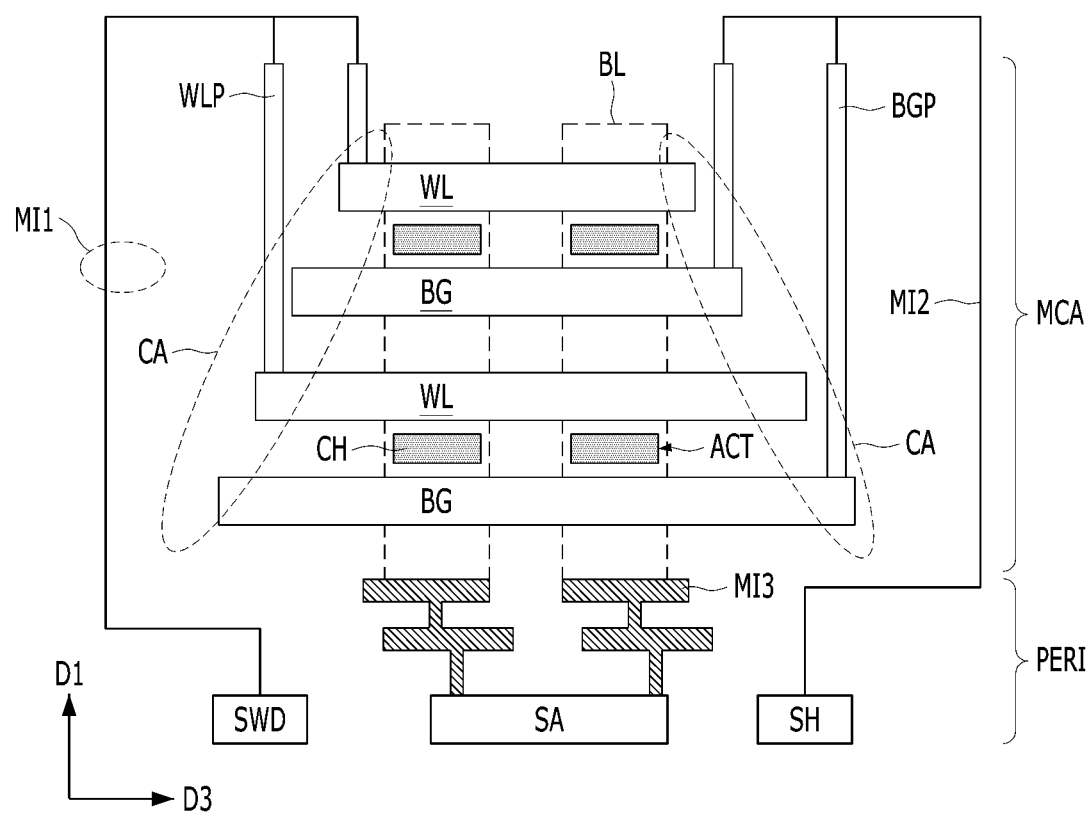
FIG. 5 is a cross-sectional view illustrating edge portions of word lines.

FIG. 3 is a schematic perspective view illustrating a semiconductor memory device according to an embodiment of the present invention. FIG. 4 is a cross-sectional view illustrating a vertical memory cell array MCA_C of FIG. 3. FIG. 5 is a cross-sectional view illustrating edge portions of the word lines.

Referring to FIGS. 3 to 5, the semiconductor memory device 100 may include a memory cell array MCA. The memory cell MC of FIG. 1 may be arranged in the first to third directions D1 to D3 and may configure a multi-layered memory cell array MCA structure. The memory cell array MCA may include a 3D array of memory cells MC. The 3D memory cell array may include a plurality of vertical memory cell arrays MCA_C and a plurality of lateral memory cell arrays MCA_R. A vertical memory cell array MCA_C may refer to an array of the memory cells MC vertically arranged along the first direction D1. A lateral memory cell array MCA_R may refer to an array of the memory cells MC laterally arranged along the third direction D3. A vertical memory cell array MCA_C may be referred to also as a column array of the memory cells MC, and a lateral memory cell array MCA_R may also be referred to as a row array of the memory cells MC. A bit line BL may be vertically oriented to be connected to a vertical memory cell array MCA_C. A word line WL may be laterally oriented to be connected to a lateral memory cell array MCA_R. A bit line BL connected to a vertical memory cell array MCA_C may be referred to as a common bit line. Neighboring vertical memory cell arrays MCA_C, disposed along the third direction D3, may be connected to different common bit lines, respectively. A word line WL connected to a lateral memory cell array MCA_R may be referred to as a common word line. Neighboring lateral memory cell arrays MCA_R, disposed along the first direction D1, may be connected to different common word lines, respectively.

The memory cell array MCA may include a plurality of memory cells MC. Each of the memory cells MC may include a vertically oriented bit line BL, a laterally oriented active layer ACT, a word line WL, a back gate BG, and a laterally oriented capacitor CAP. FIG. 3 illustrates a 3D memory cell array composed of four memory cells MC.

A single bit line BL may be connected by the neighboring active layers ACT, which are disposed along the first direction Dl. The neighboring active layers ACT, which are disposed along the third direction D3 at a same level, may share a single word line WL. Each capacitor CAP may be connected to a respective active layer ACT. The capacitors CAP may share a single plate line PL. For example, in FIG. 3, four capacitors are shown, and may all share a single plate line PL. In a variation of the described embodiment, only the capacitors aligned vertically in the first direction D1 may share a common plate line PL.

In the memory cell array MCA, a pair of the word line WL and the back gate BG may be vertically stacked along the first direction D1. Between the word line WL and the back gate BG, a plurality of active layers ACT may be laterally arranged along the third direction D3 and spaced apart from each other. For example, in the described embodiment, between the word line WL and the back gate BG, two active layers ACT are shown to be laterally arranged along the third direction D3. However, it should be understood that the specific number may change without departing form the scope of the present invention. The channel CH of the active layer ACT may be disposed between the word line WL and the back gate BG.

Referring to FIG. 5 again, the word lines WL and the back gates BG may extend in the third direction D3. Each of the word lines WL and the back gates BG may include edge portions on both of their sides, i.e., their opposite sides along the third direction D3. The edge portions may form a step shape, which may define contact portions CA. In the memory cell array MCA, edges of the word lines WL and the back gates BG may form a step shape along a stacking direction of the memory cells, that is, the first direction.

The contact portions CA of the word lines WL may be connected to a plurality of word line contact plugs WLP, respectively. The contact portions CA of the back gates BG may be connected to a plurality of back gate contact plugs BGP, respectively. The word line contact plugs WLP and the back gate contact plugs BGP may be spaced apart from each other.

The semiconductor memory device 100 may further include a substrate PERI. The substrate PERI may include a peripheral circuit. Hereafter, the substrate PERI will be abbreviated as the peripheral circuit PERI. The bit lines BL of the memory cell array MCA may be vertically oriented to a surface of the peripheral circuit PERI. The word lines WL and the back gates BG may be laterally oriented parallel to the surface of the peripheral circuit PERI.

The peripheral circuit PERI may be disposed below the memory cell array MCA. This may be referred to as a cell over PERI (COP) structure. The peripheral circuit PERI may include one or more control circuits for driving the memory cell array MCA. At least one control circuit of the peripheral circuit PERI may include an N-channel transistor, a P-channel transistor, a CMOS circuit, or a combination thereof. At least one control circuit of the peripheral circuit PERI may include an address decoder circuit, a read circuit, a write circuit, and so forth. At least one control circuit of the peripheral circuit PERI may include a planar channel transistor, a recess channel transistor, a buried gate transistor, a Fin channel transistor (FinFET), and so forth.

For example, the peripheral circuit PERI may include a sub word line driver SWD, a sub hole circuit SH, and a sense amplifier SA. The word lines WL may be connected to the sub word line drivers SWD through the word line contact plugs WLP and metal interconnections MI1. The back gates BG may be connected to the sub hole circuit SH through the back gate contact plugs BGP and metal interconnections MI2. The bit lines BL may be connected to the sense amplifier SA through metal interconnections MI3. Each of the metal interconnections MI3 may include a multi-level metal (MLM) structure including a plurality of vias and a plurality of metal interconnections.

As described above, the word line contact plugs WLP and the back gate contact plugs BGP may be spaced apart from each other. For example, an edge of the word line WL may be connected to the word line contact plug WLP on one side of the memory cell array MCA while an edge of the back gate BG may be connected to the back gate contact plug BGP on another side of the memory cell array MCA which is opposite to the one side of the memory cell array MCA along the third direction D3 as illustrated In FIG. 5.

In an embodiment, the memory cell array MCA may be disposed below the peripheral circuit PERI.

Figure 6:
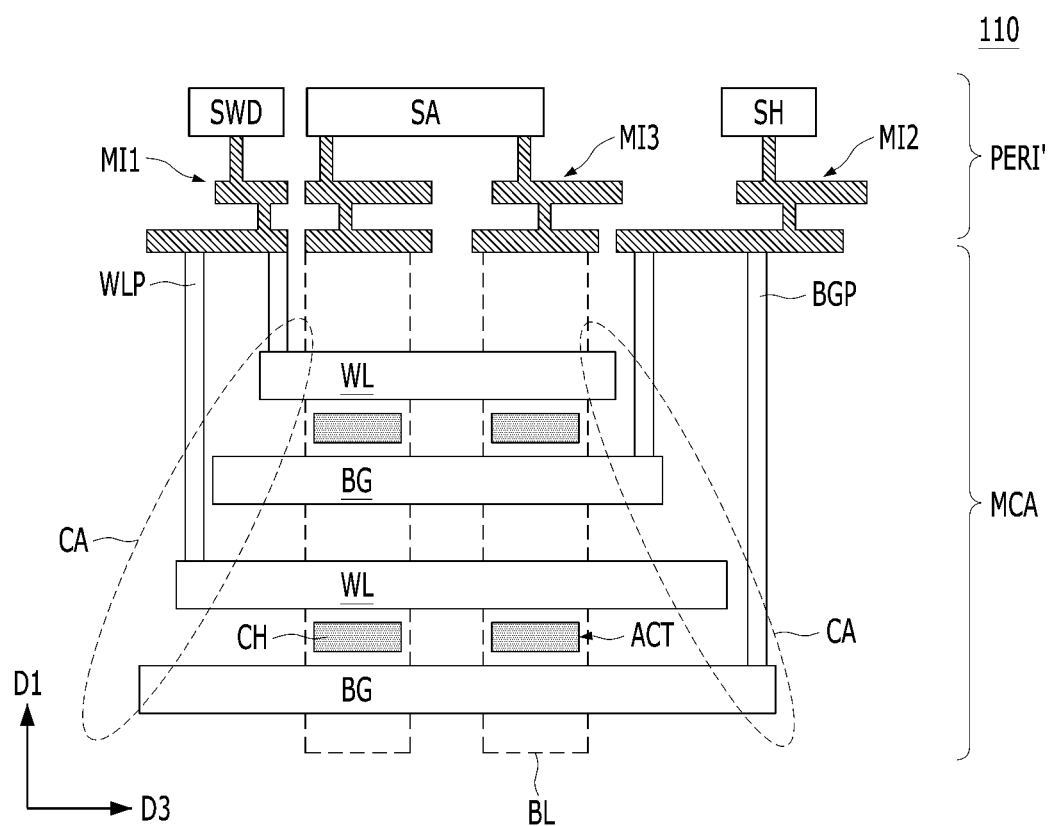
FIG. 6 is a schematic cross-sectional view illustrating a zo memory cell array of a semiconductor memory device according to an embodiment of the present invention.

FIG. 6 is a schematic cross-sectional view illustrating a memory cell array of a semiconductor memory device according to an embodiment of the present invention. FIG. 6 illustrates a semiconductor memory device 110 having a Peri over cell (POC) structure. In FIG. 6, detailed descriptions of the same components with those in FIG. 5 may be omitted.

Referring to FIG. 6, the semiconductor memory device 110 may include a memory cell array MCA and a peripheral circuit PERI'. The peripheral circuit PERI' may be positioned at a higher level than the memory cell array MCA. This may be referred to as a PERI over cell (POC) structure.

The peripheral circuit PERI' may include a sub word line driver SWD, a sub hole circuit SH, and a sense amplifier SA. Word lines WL may be connected to the sub word line drivers SWD through word line contact plugs WLP and metal interconnections MI1. Back gates BG may be connected to the sub hole circuit SH through back gate contact plugs BGP and metal interconnections MI2. Bit lines BL may be connected to the sense amplifier SA through metal interconnections MI3. Each of the metal interconnections MI3 may include a multi-level metal (MLM) structure including a plurality of vias and a plurality of metal interconnections.

FIGS. 7A to 7M are diagrams illustrating a method for fabricating a memory cell according to embodiments of the present invention.

Figure 7A:
FIGS. 7A to 7M are diagrams illustrating a method for fabricating a memory cell according to embodiments of the present invention.

As shown in FIG. 7A, a stack body SB may be formed. The stack body SB may include first and second interlayer dielectric layers 11 and 15, first and second sacrificial layers 12 and 14, and a semiconductor layer 13. The semiconductor layer 13 may be disposed between the first and second interlayer dielectric layers 11 and 15. The first sacrificial layer 12 may be disposed between the first interlayer dielectric layer 11 and the semiconductor layer 13. The second sacrificial layer 14 may be disposed between the second interlayer dielectric layer 15 and the semiconductor layer 13. The first and second interlayer dielectric layers 11 and 15 may include silicon oxide, and the first and second sacrificial layers 12 and 14 may include silicon nitride. The semiconductor layer 13 may include a semiconductor material or an oxide semiconductor material. The semiconductor layer 13 may include polysilicon or other semiconductor materials such as indium gallium zinc oxide (IGZO). The semiconductor layer 13 may serve as an active layer. The first and second sacrificial layers 12 and 14 may be formed of different materials. For example, the first sacrificial layer 12 may include a carbon-base material, and the second sacrificial layer 14 may include silicon nitride. The carbon-base material may include SiCN or SiCO. The carbon-base material may have an etch selectivity with respect to silicon nitride and silicon oxide.

Figure 7B:
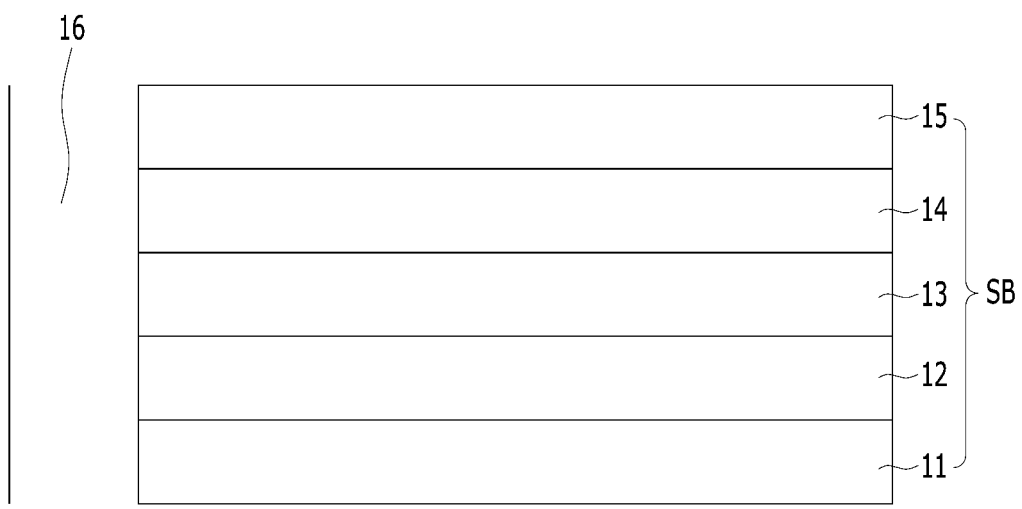

As shown in FIG. 7B, a first opening 16 may be formed by etching a portion of the stack body SB. The first opening 16 may be vertically extended.

Figure 7C:
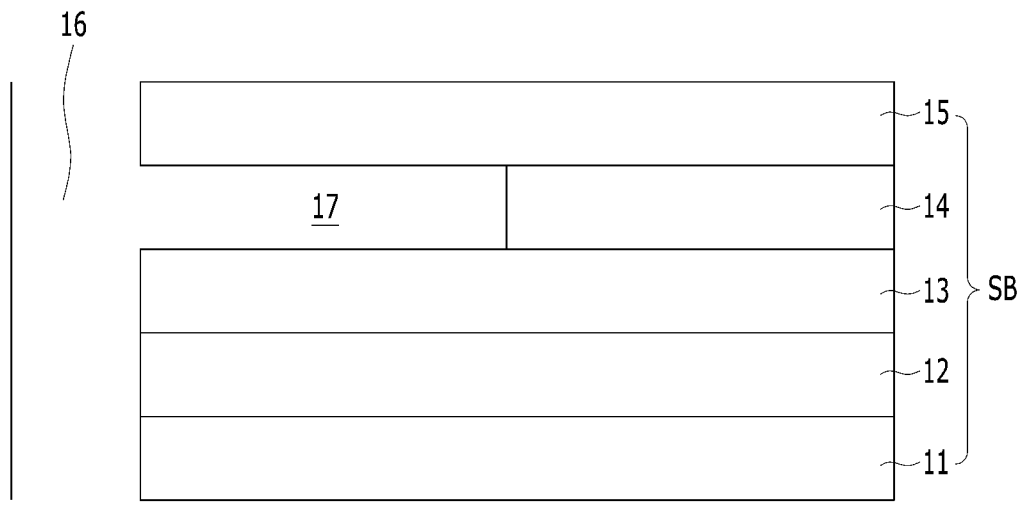

As shown in FIG. 7C, a first recess 17 may be formed by selectively etching a portion of the second sacrificial layer 14 through the first opening 16 to partially expose an upper surface of the semiconductor layer 13. The first recess 17 may be a lateral recess disposed between the semiconductor layer 13 and the second interlayer dielectric layer 15.

Figure 7D:
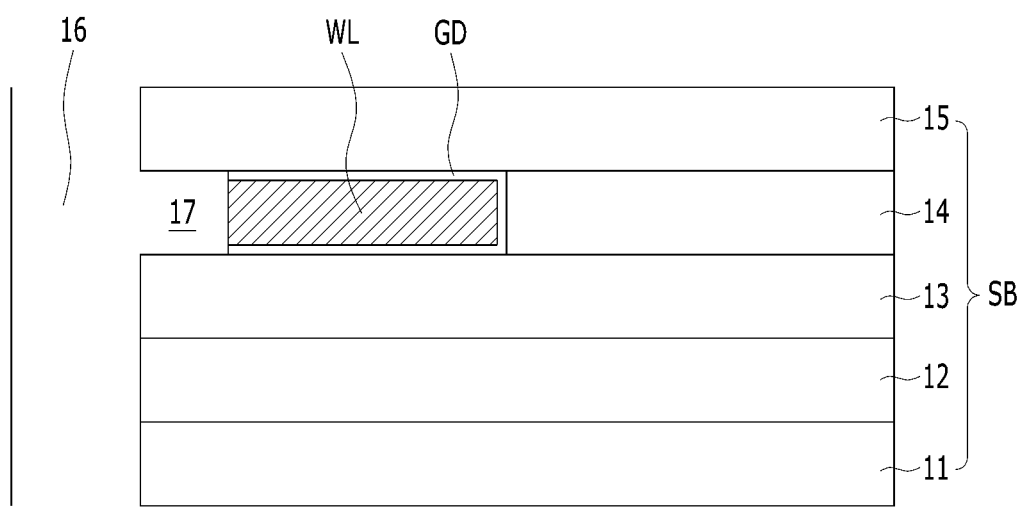

As shown in FIG. 7D, a gate dielectric layer GD may be formed conformally on the sides of the first recess 17.

Subsequently, the word line WL may be formed in the first recess 17 to fill the remaining space within the recess 17. Titanium nitride and tungsten may be deposited and an etchback process may be performed on the deposition of the titanium nitride and the tungsten to form the word line WL. The word line WL may partially fill the first recess 17.

Figure 7E:
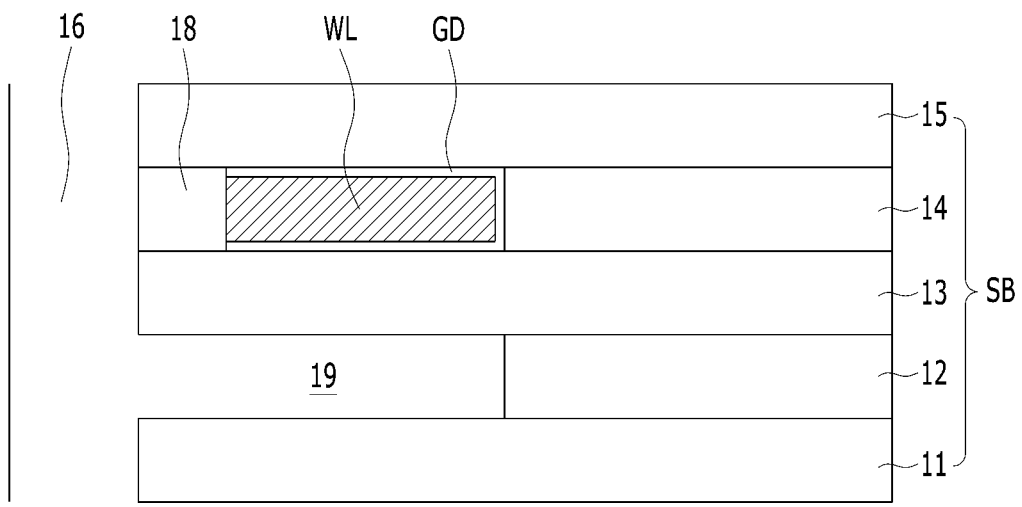

As shown in FIG. 7E, a first capping material 18 may be filled inside the first recess 17. The first capping material 18 may include silicon oxide. The first recess 17 may be filled with the gate dielectric layer GD, the word line WL, and the first capping material 18. In an embodiment, the capping material 18 may fill an end portion of the recess adjacent to the first opening 16 which is not covered by the gate dielectric layer GD and the word line WL.

Subsequently, a second recess 19 may be formed by selectively etching a portion of the first sacrificial layer 12 through the first opening 16. A bottom surface of the semiconductor layer 13 may be partially exposed by the second recess 19. The second recess 19 may also be a lateral recess parallel to the first recess 17. Lateral lengths of the first and second recesses 17 and 19 may be the same. The second recess 19 may be a lateral recess disposed between the semiconductor layer 13 and the first interlayer dielectric layer 11.

Figure 7F:
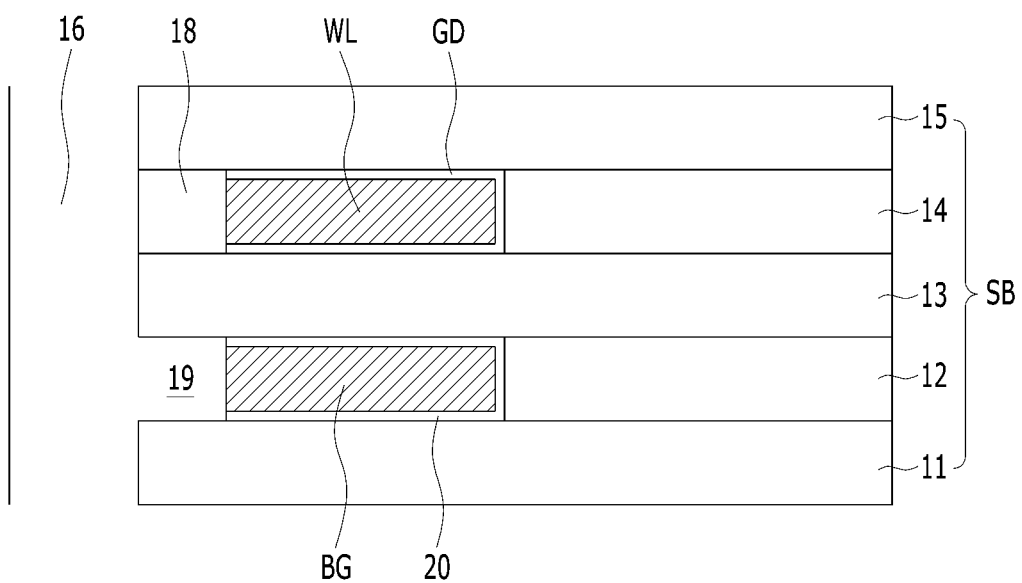

As shown in FIG. 7F, a liner material 20 may be formed conformally on the sides of the second recess 19. The liner material 20, may be an interlayer dielectric material, and may include silicon oxide. The liner material 20 and the gate dielectric layer GD may be made of the same material. The liner material 20 may serve as a gate dielectric layer.

Subsequently, the back gate BG filling the second recess 19 may be formed on the liner material 20. Titanium nitride and tungsten may be deposited and an etchback process may be performed on the deposition of the titanium nitride and the tungsten to form the back gate BG. The back gate BG and the word line WL may be made of the same material.

The word line WL and the back gate BG may face each other with the semiconductor layer 13 interposed therebetween. The word line WL and the back gate BG may correspond to the word line WL and the back gate BG referred in FIGS. 1 to 6.

In an embodiment, the word line WL may be formed after the back gate BG is formed first.

In an embodiment, the word line WL may be disposed below the semiconductor layer 13, and the back gate BG may be disposed above the semiconductor layer 13.

Next, the remaining portion of the second recess 19 may be filled with a second capping material 21. The second capping material 21 may include silicon oxide.

Figure 7G:
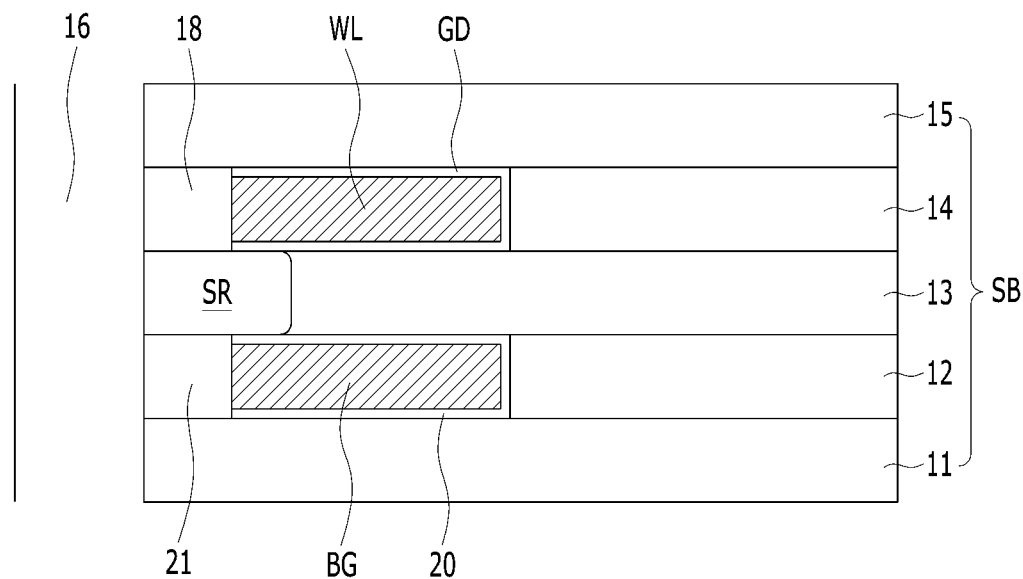

As shown in FIG. 7G, the first source/drain region SR may be formed at a first end of the semiconductor layer 13 through the first opening 16. The first source/drain region SR may be formed by an impurity doping process and heat treatment. In an embodiment, after filling the first opening 16 with polysilicon containing impurities, a subsequent heat treatment may be performed to diffuse the impurities from the polysilicon to the first end of the semiconductor layer 13. Accordingly, a first source/drain region SR may be formed at the first end of the semiconductor layer 13. A side of the first source/drain region SR may be extended to overlap with a side of the word line WL and a side of the back gate BG.

Figure 7H:
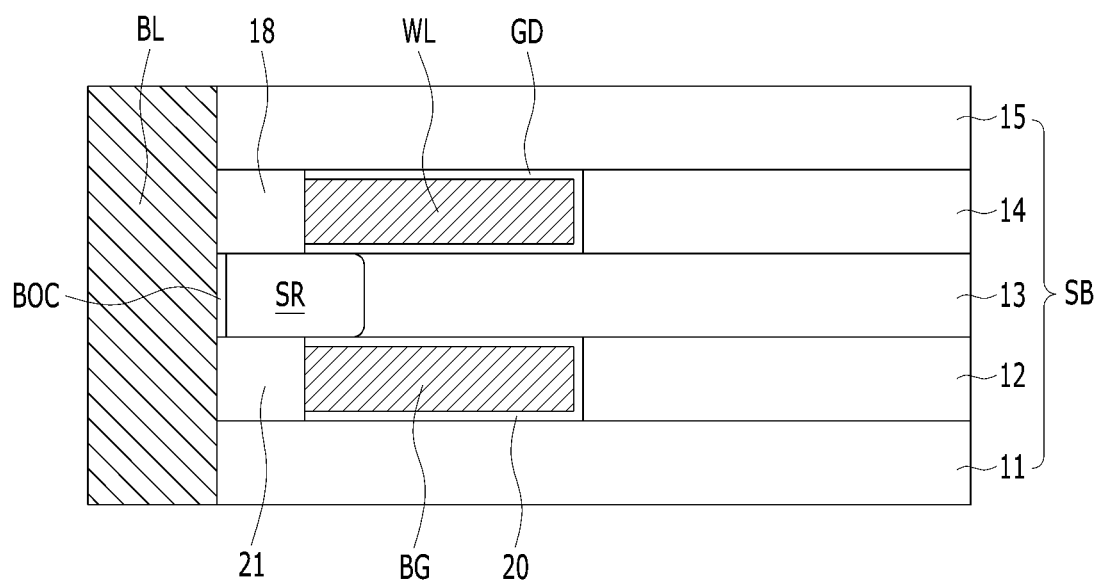

As shown in FIG. 7H, a bit line side-ohmic contact BOC contacting the first source/drain region SR may be formed. The bit line side-ohmic contact BOC may include metal silicide. For example, metal silicide may be formed by sequentially performing metal layer deposition and an annealing process on the first source/drain region SR and the first opening 16, and an unreacted metal layer may be removed. The metal silicide may be formed by a reaction between the silicon in the first source/drain region SR and the metal layer.

Next, a bit line BL contacting the bit line side-ohmic contact BOC may be formed. The bit line BL may fill the first opening 16. The bit line BL may include titanium nitride, tungsten, or a combination thereof.

Figure 7I:
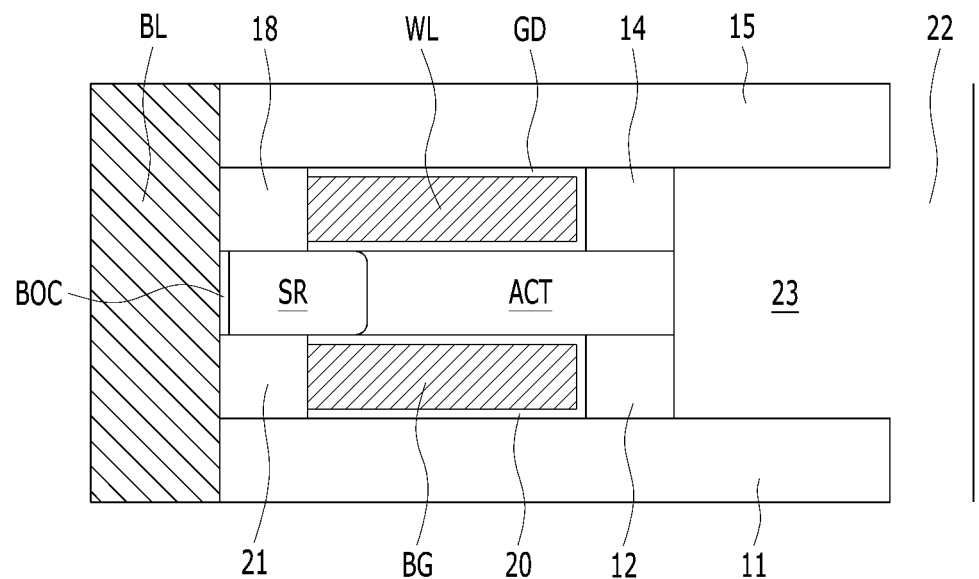

As shown in FIG. 7I, a second opening 22 may be formed by etching another portion of the stack body SB. The second opening 22 may be extended vertically.

Next, the first and second sacrificial layers 12 and 14 and the semiconductor layer 13 may be selectively recessed through the second opening 22. The recessed semiconductor layer 13 may become the active layer ACT. A recess space 23 may also be defined in which a storage node of a capacitor is to be formed.

Figure 7J:
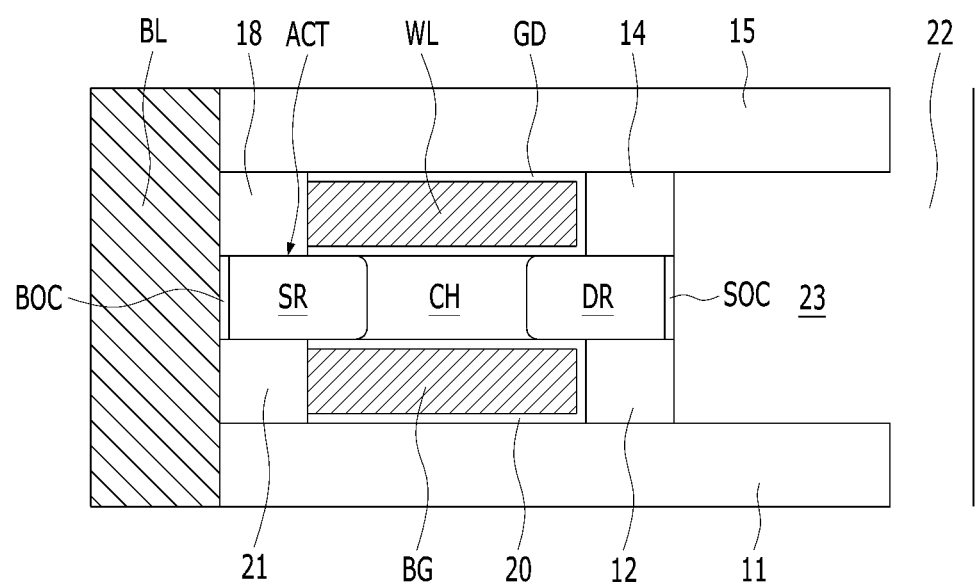

As shown in FIG. 7J, a second source/drain region DR may be formed at a second end of the active layer ACT. The second source/drain region DR may be formed by an impurity doping process and heat treatment. In an embodiment, after filling the second opening 22 with polysilicon containing impurities, a subsequent heat treatment may be performed to diffuse the impurities from the polysilicon to the second end of the active layer ACT. Accordingly, the second source/drain region DR may be formed at the second end of the active layer ACT. The channel CH may be defined between the first source/drain region SR and the second source/drain region DR. A side of the second source/drain region DR which is adjacent to the channel CH may overlap with the word line WL and the back gate BG.

Next, a storage node side-ohmic contact SOC may be formed on the second source/drain region DR. The storage node side-ohmic contact SOC may include metal silicide. For example, metal silicide may be formed by sequentially performing metal layer deposition and an annealing process on the second source/drain region DR and the recess space 23, and the unreacted metal layer may be removed. The metal silicide may be formed by a reaction between the silicon in the second source/drain region DR and the metal layer.

Figure 7K:
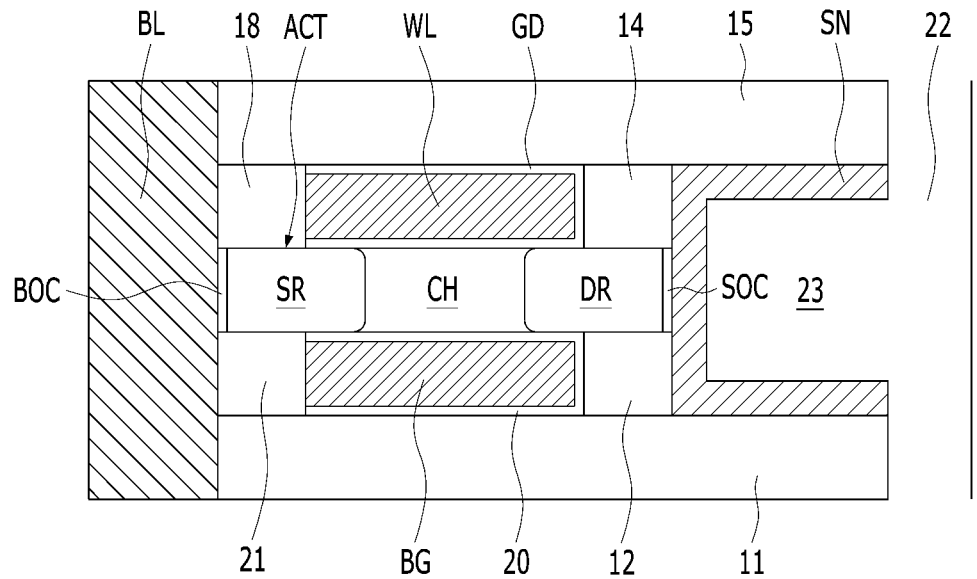

As shown in FIG. 7K, a storage node SN contacting the storage node side-ohmic contact SOC may be formed conformally on the sides of the recess space 23. In order to form the storage node SN, deposition and etchback processes of a conductive material may be performed. The storage node SN may include titanium nitride. The storage node SN may have a laterally oriented cylinder shape.

Figure 7L:
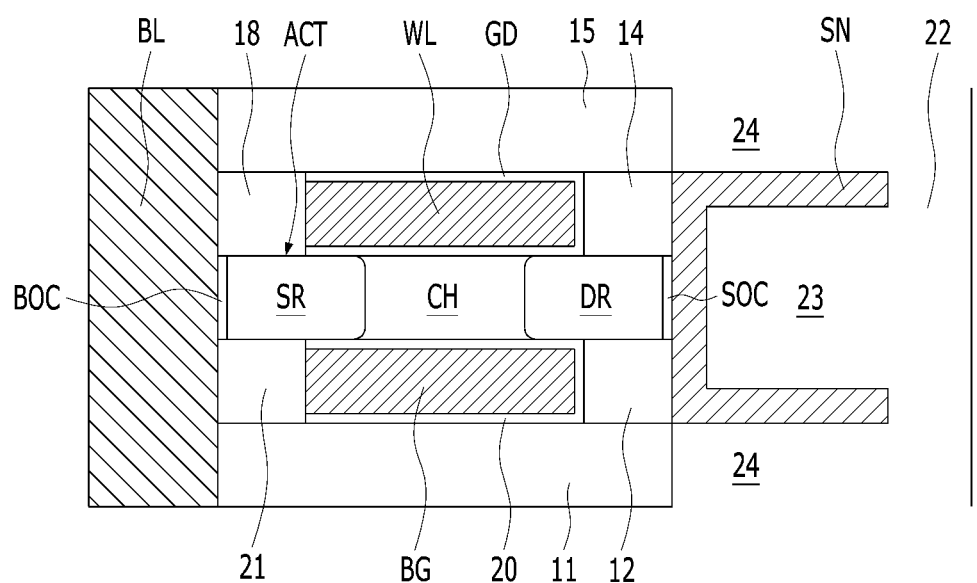

As shown in FIG. 7L, the outer walls of the storage node SN may be exposed by recessing the first and second interlayer dielectric layers 11 and 15 to form space 24.

Figure 7M:
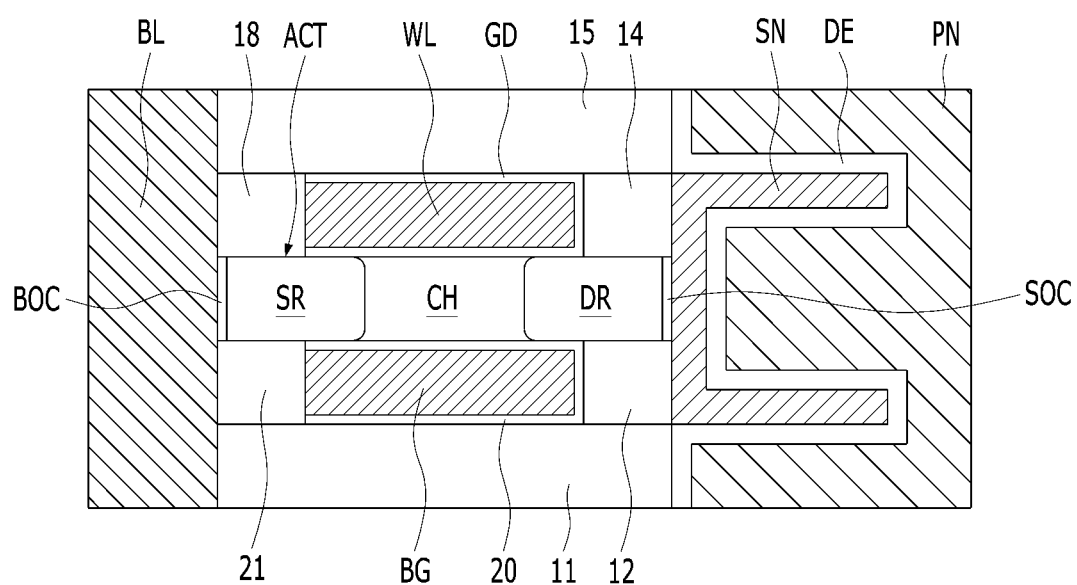

As shown in FIG. 7M, a dielectric layer DE and a plate node PN may be sequentially formed on the storage node SN. The dielectric layer DE may be formed conformally on the exposed sides of the storage node SN and on the sides of the first and second interlayer dielectric layers 11 and 15 which are facing the space 24. The plate node PN may be formed by filling the remaining of the space 24, the remaining of the recess 23 and the second opening 22 with plate node material.

Figure 8:
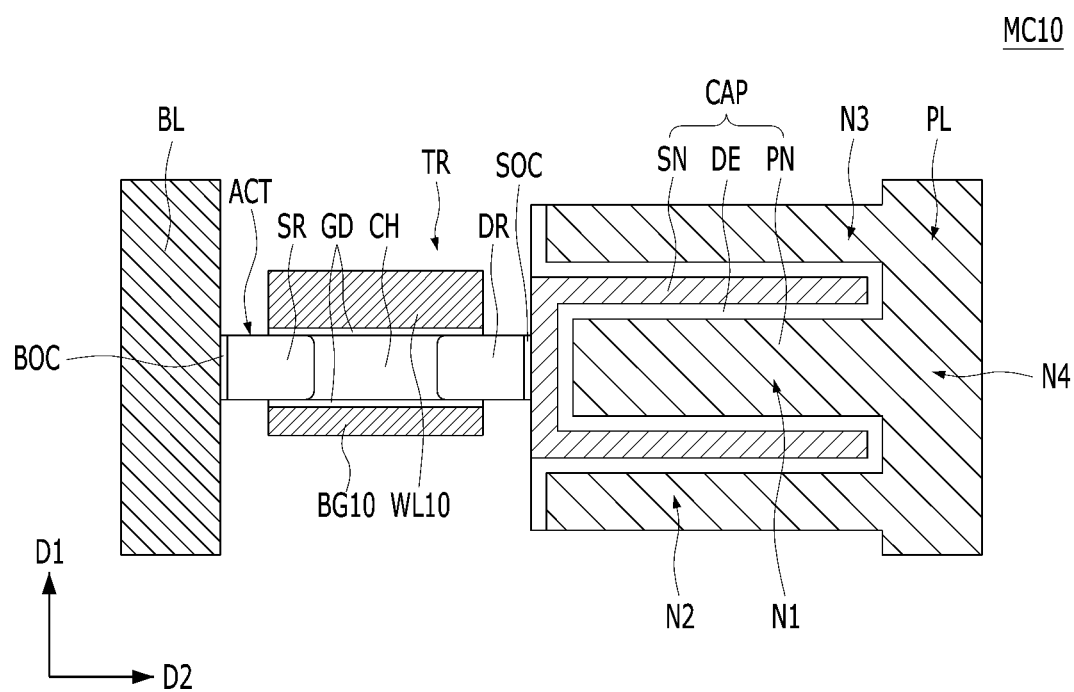
FIG. 8 is a diagram illustrating a memory cell according to an embodiment of the present invention.

FIG. 8 is a diagram illustrating a memory cell according to an embodiment of the present invention. A memory cell MC10 of FIG. 8 may be similar to the memory cell MC of FIG. 1. In FIG. 8, detailed descriptions of the same components with those in FIGS. 1 to 6 may be omitted.

Referring to FIG. 8, the memory cell MC10 of a 3D semiconductor memory device may include a bit line BL, a transistor TR, and a capacitor CAP. The transistor TR may include an active layer ACT, a gate dielectric layer GD, and a word line WL10. The capacitor CAP may include a storage node SN, a dielectric layer DE, and a plate node PN, with the dielectric layer being disposed between the storage node SN and the plate node PN. The bit line BL may have a pillar shape extending in the first direction Dl. The active layer ACT may have a bar shape extending in the second direction D2 intersecting with the first direction D1. The word line WL10 may have a line shape extending in the third direction D3 intersecting with the first and second directions D1 and D2. The plate node PN of the capacitor CAP may be connected to the plate line PL.

The memory cell MC10 may further include a back gate BG10. The word line WL10 and the back gate BG10 may face each other with the active layer ACT interposed therebetween. The word line WL10 may be disposed above the active layer ACT. The back gate BG10 may be disposed below the active layer ACT. The back gate BG10 may be thinner than the word line WL10. The back gate BG10 and the word line WL10 may be formed of the same material. In an embodiment, the word line WL10 may be disposed below the active layer ACT, and the back gate BG10 may be disposed above the active layer ACT.

Edge portions on both sides of the word line WL10 and the back gate BG10 may form a step shape, as shown in FIG. 5.

Figure 9A:
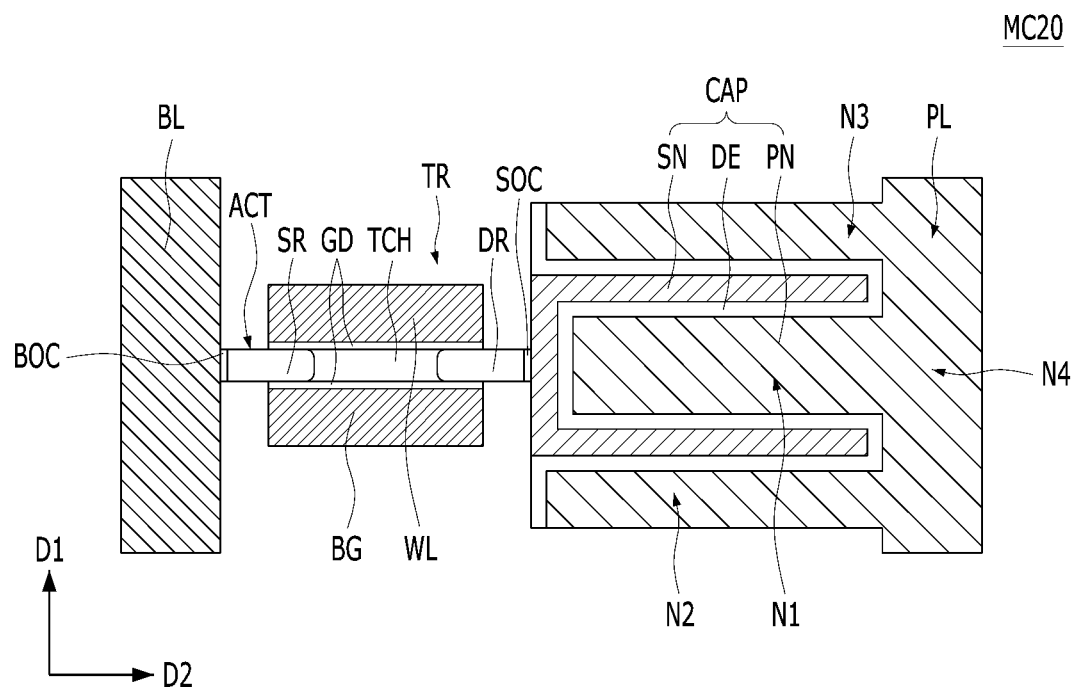
FIG. 9A is a diagram illustrating a memory cell according to an embodiment of the present invention.

FIG. 9A is a diagram illustrating a memory cell according to an embodiment of the present invention. The memory cell MC20 of FIG. 9A may be similar to the memory cell MC of FIG. 1. In FIG. 9A, detailed descriptions of the same components with those in FIGS. 1 to 6 may be omitted.

Referring to FIG. 9A, a memory cell MC20 of a 3D semiconductor memory device may include a bit line BL, a transistor TR, and a capacitor CAP. The transistor TR may include an active layer ACT, a gate dielectric layer GD, and a word line WL. The capacitor CAP may include a storage node SN, a dielectric layer DE, and a plate node PN. The bit line BL may have a pillar shape extending in the first direction D1. The active layer ACT may have a bar shape extending in the second direction D2 intersecting with the first direction D1. The word line WL may have a line shape extending in the third direction D3 intersecting with the first and second directions D1 and D2. The plate node PN of the capacitor CAP may be connected to the plate line PL.

The memory cell MC20 may further include the back gate BG. The word line WL and the back gate BG may face each other with the active layer ACT interposed therebetween. The word line WL may be disposed above the active layer ACT, and the back gate BG may be disposed below the active layer ACT. The back gate BG and the word line WL may have the same thickness. The back gate BG and the word line WL may be formed of the same material. In an embodiment, the word line WL may be disposed below the active layer ACT, and the back gate BG may be disposed above the active layer ACT.

Edge portions on both sides of the word line WL and the back gate BG may form a step shape, as shown in FIG. 5.

The active layer ACT may include a thin-body channel TCH which is thinner than the word line WL and the back gate BG. The thin-body channel TCH may have a thickness of 1 nm to 7 nm. The thin-body channel TCH may include a semiconductor material or an oxide semiconductor material. For example, the thin-body channel TCH may include polysilicon, silicon-germanium, or indium gallium zinc oxide (IGZO). The active layer ACT may include a first source/drain region SR and a second source/drain region DR on both sides of the thin-body channel TCH. The first source/drain region SR may be connected to the bit line BL, and the second source/drain region DR may be connected to the capacitor CAP. A bit line side-ohmic contact BOC may be formed between the first source/drain region SR and the bit line BL, and a storage node side-ohmic contact SOC may be formed between the second source/drain region DR and the capacitor CAP.

Figure 9B:
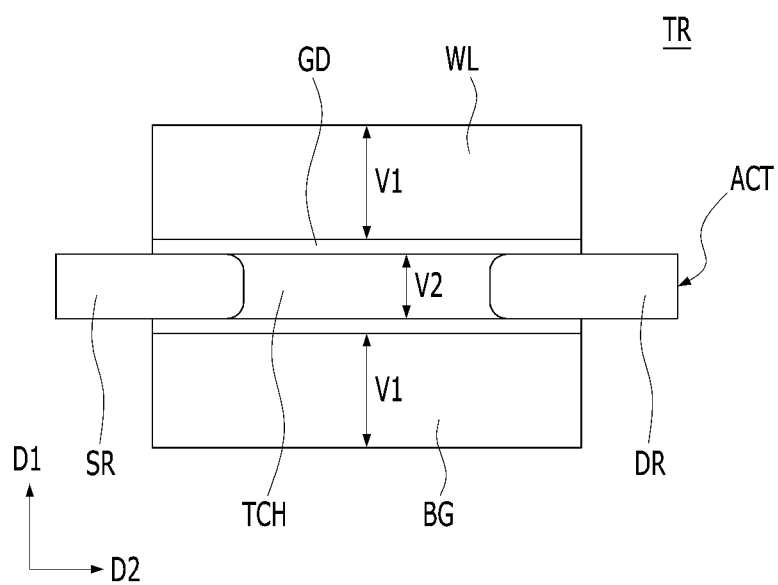
FIG. 9B is a detailed view of the transistor of FIG. 9A.

FIG. 9B is a detailed view of the transistor of FIG. 9A.

Referring to FIG. 9B, in the transistor TR, the word line WL and the back gate BG may face each other with the active layer ACT interposed therebetween. The word line WL and the back gate BG may have a first thickness V1. The active layer ACT may have a second thickness V2. The second thickness V2 may be smaller or thinner than the first thickness V1. The thin-body channel TCH may have the second thickness V2, and the thin-body channel TCH may be thinner than the word line WL and the back gate BG. In an embodiment, the back gate BG may be thinner than the word line WL, and in this case, the back gate BG may have a thickness equal to or thicker than that of the thin-body channel TCH.

The degree of integration of memory cells stacked along the first direction D1 may be improved by the thin thin-body channel TCH. A transistor with the thin-body channel TCH may be applied to a double gate DG field effect transistor, FinFET, gate all-around (GAA) field effect transistor, and multi-bridge thin-body channel field effect transistor.

Figure 10:
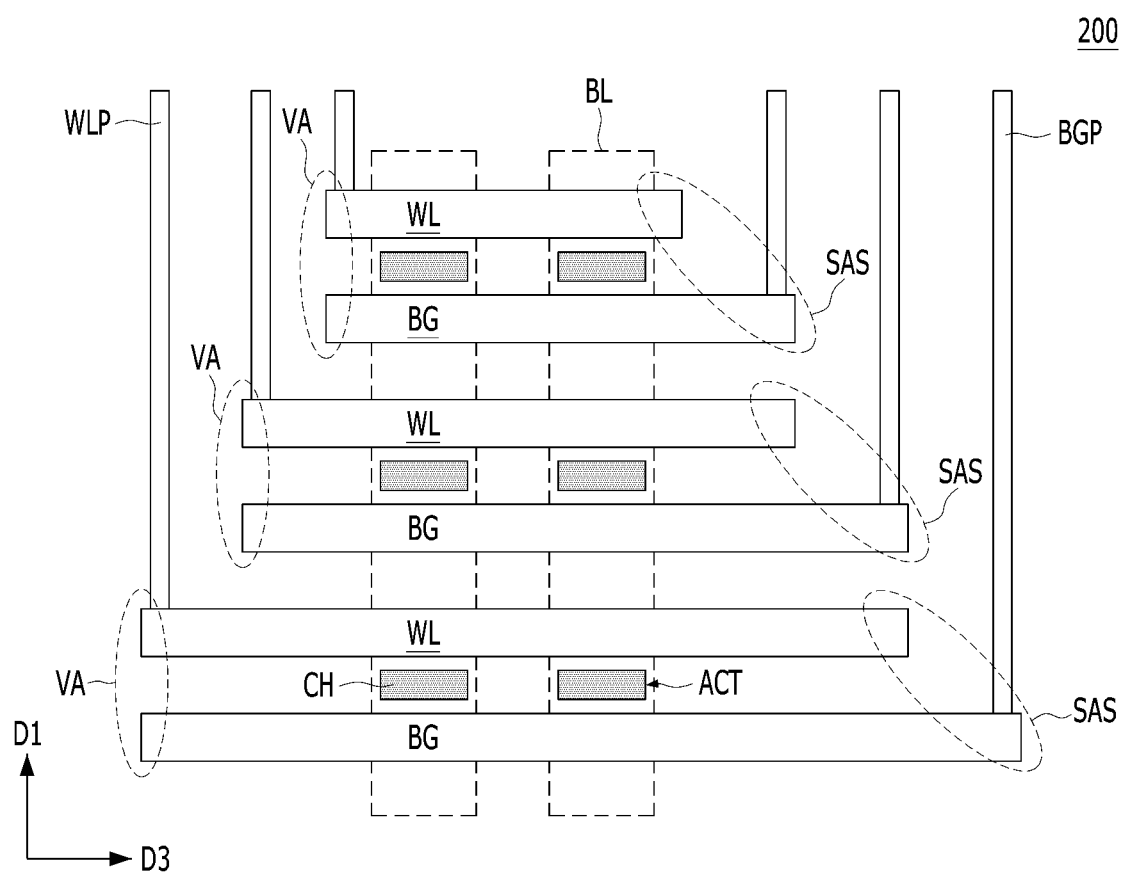
FIG. 10 is a cross-sectional view of a memory cell array according to an embodiment of the present invention.

FIG. 10 is a cross-sectional view of a memory cell array according to an embodiment of the present invention. In FIG. 10, detailed descriptions of the same components with those in FIG. 5 may be omitted.

Referring to FIG. 10, in a memory cell array 200, word lines WL and back gates BG may be vertically stacked along a first direction Dl. The word lines WL and the back gates BG may extend along the third direction D3, and edge portions on both sides of the word lines and the back gates BG may form a step shape. In the memory cell array 200, edges of the word lines WL and edges of the back gates BG may have a step shape along a stacking direction of memory cells, that is, the first direction D1.

A plurality of word line contact plugs WLP may be connected to the respective edges of the word lines WL. A plurality of back gate contact plugs BGP may be connected to the respective edges of the back gates BG. The word line contact plugs WLP and the back gate contact plugs BGP may be spaced apart from each other.

A pair of the word line WL and the back gate BG may include a vertical alignment step VA and a slope alignment step SAS. The vertical alignment step VA may be formed when one side of the word line WL and one side of the back gate BG are self-aligned. The slope alignment step SAS may be formed when the other side of the back gate BG is longer than the other side of the word line WL and thus being inclinedly aligned. More specifically, as shown in FIG. 10, a first pair of a word line WL and back gate BG may form a slope alignment step SAS at one side thereof which is proximate to the back gate plug side BGPS of the memory cell array 200 with the word line WL in the first pair being shorter in the third direction D3 than the backgate BG. Moreover, a second pair of a word line WL and a back gate BG which is stacked on the first pair may have a back gate BG which has a length that is less than the length of the word line WL of the first pair so that a top surface of an end portion of the first pair word line WL is not overlapped by the second pair word line to allow for the forming of the word line plug WLP. The word line of the second pair may be vertically aligned with the back gate BG of the second pair at their ends which are proximate to the word line plug side WLPS of the memory cell array 200. Moreover, the word line WL of the second pair may have a length in the third direction D3 that is less than the length of the back gate BG of the second pair to form the slope alignment step SAS at their ends which are proximate to the back gate plug side BGPS of the memory cell array 200. Likewise, third pair of a word line WL and a back gate BG may be stacked over the second pair and form a slope alignment step SAS at their ends which are proximate the back gate plug side BGPS of the memory cell array 200 and a vertical alignment step VA at their opposite ends which are proximate the word line plug side WLPS of the memory cell array 200.

In the memory cell array 200, a pair of the vertical alignment steps VA may be stacked multiple times along the first direction Dl. In addition, in the memory cell array 200, a pair of the slope alignment steps SAS may be stacked multiple times along the first direction D1.

Although the disclosure is shown and described with reference to specific embodiments thereof, the present invention is not limited thereto. It will readily be appreciated by one of ordinary skill in the art that various changes or modifications may be made thereto without departing from the scope of the disclosure.

What is claimed is:

1. A semiconductor memory device, comprising:
   a memory cell array in which a plurality of memory cells is vertically stacked to a substrate,
   wherein each of the memory cells includes:
   a bit line vertically oriented to the substrate;
   a capacitor laterally spaced apart from the bit line;
   an active layer laterally oriented between the bit line and the capacitor; and
   a word line and a back gate facing each other with the active layer interposed therebetween,
   wherein an edge of the word line and an edge of the back gate form a step shape along a stacking direction of the memory cells.

2. The semiconductor memory device of claim 1, further including a word line contact plug and a back gate contact plug connected to the edge of the word line and the edge of the back gate having a step shape, respectively.

3. The semiconductor memory device of claim 2, wherein the word line contact plug is disposed on an edge of one side of the memory cell array, and the back gate contact plug is disposed on an edge of another side of the memory cell array which is opposite to said one side.

4. The semiconductor memory device of claim 1, wherein the active layer includes:
   a first source/drain region connected to the bit line;
   a second source/drain region connected to the capacitor; and
   a channel between the first source/drain region and the second source/drain region,
   wherein the channel is thinner than the second source/drain region.

5. The semiconductor memory device of claim 4, wherein the word line and the back gate face each other with the channel interposed therebetween,
   the word line is disposed above the channel, and
   the back gate is disposed below the channel.

6. The semiconductor memory device of claim 4, wherein the word line and the back gate face each other with the channel interposed therebetween,
   the word line is disposed below the channel, and
   the back gate is disposed above the channel.

7. The semiconductor memory device of claim 4, wherein the channel has a thickness thinner than a thickness of each of the word line and the back gate.

8. The semiconductor memory device of claim 4, wherein the channel has a thickness of 1 nm to 7 nm.

9. The semiconductor memory device of claim 1, wherein the word line and the back gate include the same material.

10. The semiconductor memory device of claim 1, wherein the active layer includes polysilicon, silicon-germanium, or indium gallium zinc oxide.

11. The semiconductor memory device of claim 1, wherein the memory cell array includes a DRAM cell array.

12. The semiconductor memory device of claim 1,
   wherein the capacitor includes:
   a storage node which is connected to the active layer and laterally oriented;
   a dielectric layer on the storage node; and
   a plate node on the dielectric layer, wherein the storage node has a cylinder shape.

13. The semiconductor memory device of claim 1, wherein the substrate includes a peripheral circuit for controlling the memory cell array.

14. The semiconductor memory device of claim 13, wherein the peripheral circuit includes a sub word line driver for controlling the word lines and a sub hole circuit for controlling the back gates.

15. The semiconductor memory device of claim 14, wherein the sub word line driver and the memory cell array are vertically overlapped.

16. A semiconductor memory device, comprising:
- a memory cell array in which a plurality of memory cells is stacked vertical to a substrate,
- wherein each of the memory cells includes:
- a bit line vertically oriented to the substrate;
- a capacitor laterally spaced apart from the bit line;
- an active layer including a thin-body channel, the thin-body channel being laterally disposed between the bit line and the capacitor; and
- a word line and a back gate facing each other with the thin-body channel interposed therebetween,
- wherein an edge of the word line and an edge of the back gate form a step shape along a stacking direction of the memory cells.

17. The semiconductor memory device of claim 16, further including a word line contact plug and a back gate contact plug connected to the edge of the word line and the edge of the back gate having a step shape, respectively.

18. The semiconductor memory device of claim 17, wherein the word line contact plug is disposed on an edge of one side of the memory cell array, and the back gate contact plug is disposed on an edge of another side of the memory cell array which is opposite to said one side.

19. The semiconductor memory device of claim 16, wherein the word line is disposed above the thin-body channel, and the back gate is disposed below the thin-body channel.

20. The semiconductor memory device of claim 16, wherein the word line is disposed below the thin-body channel, and the back gate is disposed above the thin-body channel.

21. The semiconductor memory device of claim 16, wherein the thin-body channel has a thickness thinner than a thickness of each of the word line and the back gate.

22. The semiconductor memory device of claim 16, wherein the thin-body channel has a thickness of 1 nm to 7 nm.

23. The semiconductor memory device of claim 16, wherein the thin-body channel includes polysilicon, silicon-germanium, or indium gallium zinc oxide.

* * * * *